(12) United States Patent
Nomura et al.

(10) Patent No.: US 11,133,156 B2
(45) Date of Patent: Sep. 28, 2021

(54) ELECTRODE PLATE FOR PLASMA PROCESSING APPARATUS AND METHOD FOR REGENERATING ELECTRODE PLATE FOR PLASMA PROCESSING APPARATUS

(71) Applicant: MITSUBISHI MATERIALS CORPORATION, Tokyo (JP)

(72) Inventors: Satoshi Nomura, Sanda (JP); Syuji Fujimori, Akita (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 34 days.

(21) Appl. No.: 16/484,857

(22) PCT Filed: Feb. 14, 2018

(86) PCT No.: PCT/JP2018/005023
§ 371 (c)(1),
(2) Date: Aug. 9, 2019

(87) PCT Pub. No.: WO2018/151137
PCT Pub. Date: Aug. 23, 2018

(65) Prior Publication Data
US 2020/0043707 A1    Feb. 6, 2020

(30) Foreign Application Priority Data
Feb. 16, 2017 (JP) .............................. JP2017-027039

(51) Int. Cl.
*H01J 37/32* (2006.01)
*C23C 16/32* (2006.01)
*H01L 21/67* (2006.01)

(52) U.S. Cl.
CPC ...... *H01J 37/32541* (2013.01); *C23C 16/325* (2013.01); *H01J 37/3255* (2013.01);
(Continued)

(58) Field of Classification Search
CPC ............ H01J 37/32541; H01J 37/3255; H01J 2237/3321; H01J 2237/334; C23C 16/325;
(Continued)

(56) References Cited

U.S. PATENT DOCUMENTS 6,894,245 B2 * 5/2005 Hoffman ........... H01J 37/32082
118/723 I
6,936,102 B1 8/2005 Otsuki et al.
(Continued)

FOREIGN PATENT DOCUMENTS

CN 1612311 A 5/2005
EP 1691396 A2 8/2006
(Continued)

OTHER PUBLICATIONS

International Search Report dated Apr. 10, 2018, issued for PCT/JP2018/005023 and English translation thereof.
(Continued)

*Primary Examiner* — Rudy Zervigon
(74) *Attorney, Agent, or Firm* — Locke Lord LLP; James E. Armstrong, IV; Nicholas J. DiCeglie, Jr.

(57) ABSTRACT

According to the present invention, an electrode plate for a plasma processing apparatus is provided, which includes an air hole through which a gas for plasma generation passes, the electrode plate for a plasma processing apparatus including: a base; and a coating layer provided on at least one front surface of the base, and in which the base is formed of a material having a plasma resistance higher than the plasma resistance of a material forming the coating layer.

7 Claims, 4 Drawing Sheets

(52) U.S. Cl.
CPC .. *H01L 21/67069* (2013.01); *H01J 2237/334* (2013.01); *H01J 2237/3321* (2013.01)

(58) Field of Classification Search
CPC ........... C23C 16/4404; H01L 21/67069; H01L 21/3065; H01L 21/31; C04B 41/87
USPC ........ 118/723 E; 156/345.43, 345.44, 345.45
See application file for complete search history.

(56) References Cited

U.S. PATENT DOCUMENTS

| | | | | |
|---|---|---|---|---|
| 7,030,335 | B2* | 4/2006 | Hoffman | H01J 37/32082 |
| | | | | 118/723 I |
| 9,082,593 | B2* | 7/2015 | Hayashi | C23C 16/50 |
| 2004/0058070 | A1* | 3/2004 | Takeuchi | C23C 4/01 |
| | | | | 427/282 |
| 2005/0106869 | A1 | 5/2005 | Ooyabu et al. | |
| 2010/0212148 | A1 | 8/2010 | Kawahara | |
| 2013/0023062 | A1* | 1/2013 | Masuda | C23C 16/481 |
| | | | | 438/3 |
| 2014/0116338 | A1* | 5/2014 | He | C23C 14/083 |
| | | | | 118/723 E |

FOREIGN PATENT DOCUMENTS

| | | |
|---|---|---|
| JP | 2001-044179 A | 2/2001 |
| JP | 2001-107239 A | 4/2001 |
| JP | 2004-356124 A | 12/2004 |
| JP | 2005-285845 A | 10/2005 |
| JP | 2009-004796 A | 1/2009 |
| WO | 2008/146918 A1 | 12/2008 |

OTHER PUBLICATIONS

Office Action issued in corresponding Chinese Patent Application No. CN 201880011409.X, dated Nov. 20, 2020.
Office Action issued in Japanese Patent Application No. JP 2017-027039, dated Jan. 19, 2021.

* cited by examiner

ELECTRODE PLATE FOR PLASMA PROCESSING APPARATUS AND METHOD FOR REGENERATING ELECTRODE PLATE FOR PLASMA PROCESSING APPARATUS

TECHNICAL FIELD

The present invention relates to an electrode plate for a plasma processing apparatus and a method for regenerating the electrode plate for a plasma processing apparatus.

Priority is claimed on Japanese Patent Application No. 2017-027039, filed on Feb. 16, 2017, the content of which is incorporated herein by reference.

BACKGROUND ART

In a plasma processing apparatus such as a plasma etching apparatus or a plasma CVD apparatus that is used in a semiconductor device manufacturing process, a pair of electrodes that are vertically disposed to face each other are provided in a vacuum chamber. In general, air holes for passing a gas for plasma generation are formed on an upper electrode. A lower electrode is a support stand, and is configured to fix a substrate to be processed such as a wafer. By supplying the gas for plasma generation from the air holes of the upper electrode to the substrate to be processed which is fixed to the lower electrode and applying a high-frequency voltage between the upper electrode and the lower electrode, plasma is generated, and thus processing such as etching is performed on the substrate to be processed.

In the plasma processing apparatus with such a configuration, the electrode is gradually consumed as plasma is applied to the electrode during etching processing. For this reason, in order to improve a plasma resistance of the electrode, it is considered to provide a coating layer on a front surface of the electrode and to regenerate the electrode by recoating the coating layer on the front surface of the electrode consumed by applied plasma.

Patent Document 1 discloses a technique of forming a dense silicon carbide layer on a front surface of an electrode for a plasma etching apparatus (a gas blow-off plate) on a side from which the gas for plasma generation is ejected. In Patent Document 1, examples of the dense silicon carbide layer include an SiC (CVD-SiC) formed by a chemical vapor deposition method (CVD method), and a sintered body layer made of a dense silicon carbide sintered body.

Patent Document 2 discloses a method for regenerating an electrode, which includes a first substrate made of a first material and an electrode surface layer formed on a front surface of the first substrate and made of a second material, by coating a front surface of the consumed electrode surface layer with the second material. In Patent Document 2, a sintered SiC is described as an example of the first material, and a CVD-SiC is described as an example of the electrode surface layer (second material).

CITATION LIST

Patent Document

[Patent Document 1] Japanese Unexamined Patent Application, First Publication No. 2005-285845

[Patent Document 2] PCT International Publication No. WO2008/146918

SUMMARY OF INVENTION

Technical Problem

In order to improve the plasma resistance of the electrode plate for a plasma processing apparatus, a method of providing a coating layer having a high plasma resistance on the front surface of the electrode is one of effective methods. On the other hand, according to a study by the inventors, even when the coating layer has a high plasma resistance, in a case where a base has a low plasma resistance, inner walls of the air holes of the base may be consumed before the coating layer is consumed by plasma. When the inner wall of the air hole is consumed and thus the hole diameter of the air hole is widened, the flow rate of the gas for plasma generation may be changed. As a result, it may be difficult to stably perform etching processing.

The present invention has been made in consideration of the above-described circumstances, and an object of the present invention is to provide an electrode plate for a plasma processing apparatus in which the inner wall of the air hole is unlikely to be consumed, and a method for regenerating the electrode plate for a plasma processing apparatus.

Solution to Problem

In order to solve the above-mentioned problem, according to an aspect of the present invention, an electrode plate for a plasma processing apparatus is provided, which includes an air hole through which a gas for plasma generation passes, the electrode plate including a base and a coating layer provided on at least one front surface of the base, and in which the base is formed of a material having a plasma resistance higher than the plasma resistance of a material forming the coating layer.

In the electrode plate for a plasma processing apparatus according to the aspect of the present invention, the base is formed of a material having a plasma resistance higher than the plasma resistance of a material forming the coating layer. Thereby, an inner wall of the air hole of the base is less likely to be consumed by plasma than the coating layer is consumed. Accordingly, the electrode plate for a plasma processing apparatus according to the aspect of the present invention can be stably used for a long time without causing a change in the flow rate of the gas for plasma generation during etching processing using plasma.

In the electrode plate for a plasma processing apparatus according to the aspect of the present invention, preferably, the material forming the base is one or a mixture of two or more selected from the group consisting of $Y_2O_3$, $Al_2O_3$, and AlN, or a mixture of SiC and one or more selected from the group consisting of $Y_2O_3$, $Al_2O_3$, and AlN, and the material forming the coating layer is dense silicon carbide.

In this case, the plasma resistance of the base can be reliably higher than the plasma resistance of the coating layer. In addition, the coating layer is formed of dense silicon carbide. Therefore, the material of the base is prevented from being transferred to a wafer, and thus it is possible to prevent contamination of the wafer.

According to another aspect of the present invention, a method for regenerating an electrode plate for a plasma processing apparatus, in which the electrode plate for a plasma processing apparatus includes an air hole through which a gas for plasma generation passes, in which the electrode plate for a plasma processing apparatus includes a base and a coating layer provided on at least one front surface of the base, and in which the coating layer is formed of dense silicon carbide and the base is formed of a material having a plasma resistance higher than the plasma resistance of the dense silicon carbide, and the method includes a step of recoating a dense silicon carbide layer on a front surface of the electrode plate for the plasma processing apparatus by chemical vapor deposition after consuming a front surface of the coating layer by plasma; and a step of removing the dense silicon carbide layer coated on a surface of the air hole of the electrode plate for a plasma processing apparatus.

In the method for regenerating the electrode plate for a plasma processing apparatus according to the aspect of the present invention, the base is formed of a material having a plasma resistance higher than the plasma resistance of the dense silicon carbide forming the coating layer. Thus, it is possible to regenerate the electrode plate for a plasma processing apparatus before the inner wall of the air hole of the base is consumed. Therefore, according to the method for regenerating the electrode plate for a plasma processing apparatus according to the aspect of the present invention, it is possible to regenerate the electrode plate for a plasma processing apparatus without changing the flow rate of the gas for plasma generation.

Advantageous Effects of Invention

According to the present invention, it is possible to provide the electrode plate for a plasma processing apparatus in which the inner wall of the air hole is unlikely to be consumed, and a method for regenerating the electrode plate for a plasma processing apparatus.

DESCRIPTION OF EMBODIMENTS

Hereinafter, an electrode plate for a plasma processing apparatus according to an embodiment of the present invention, and a method for regenerating the electrode plate for a plasma processing apparatus will be described with reference to the accompanying drawings.

The electrode plate for a plasma processing apparatus according to the present embodiment is used, for example, as an upper electrode of a pair of electrodes provided in a vacuum chamber of a plasma processing apparatus such as a plasma etching apparatus or a plasma CVD apparatus used in a semiconductor device manufacturing process.

Figure 1A:
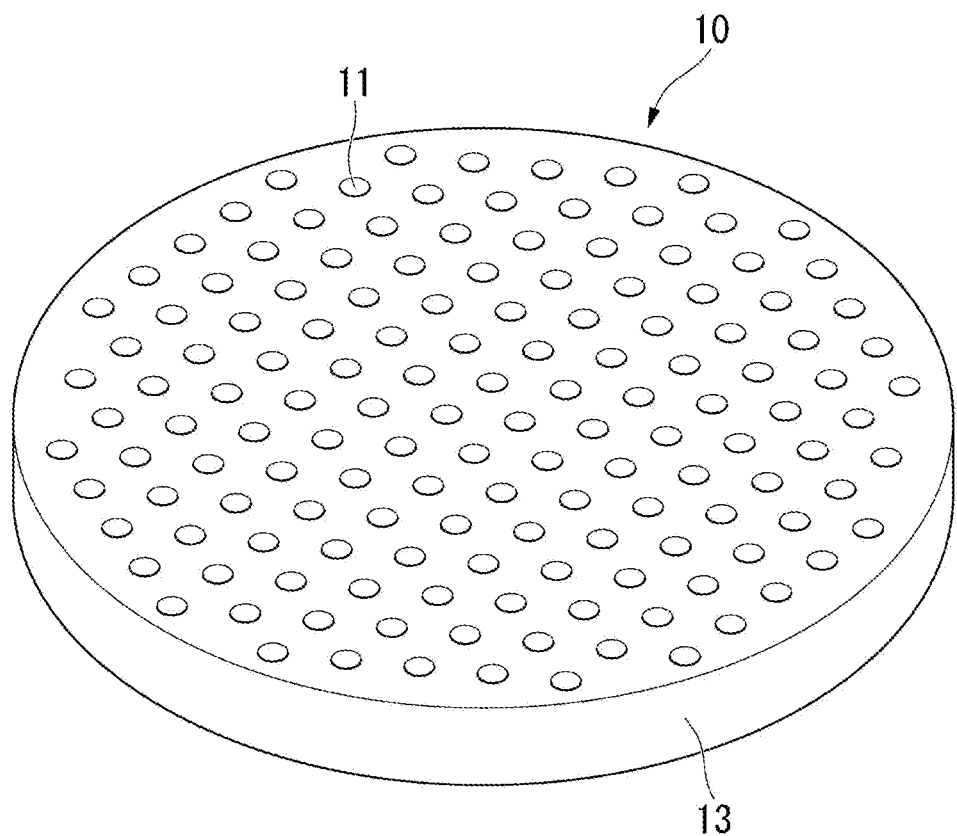
FIG. 1A is a schematic explanatory view of an electrode plate for a plasma processing apparatus according to the present embodiment, and is a perspective view of the electrode plate.
Figure 1B:
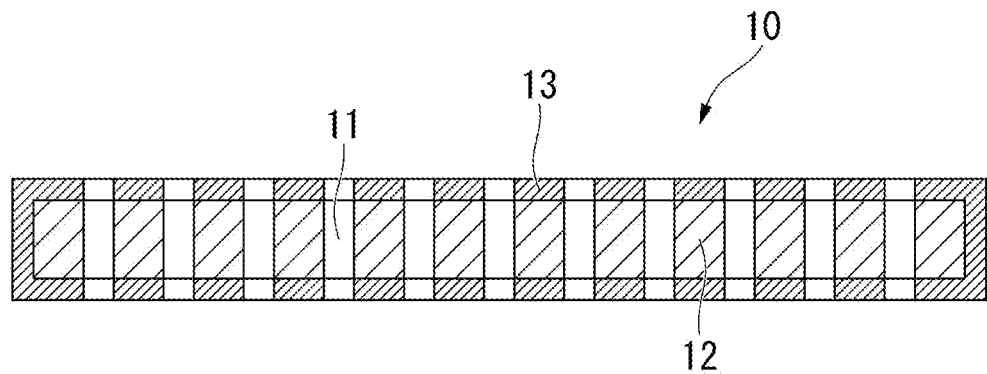
FIG. 1B is a schematic explanatory view of the electrode plate for a plasma processing apparatus according to the present embodiment, and is a sectional view of the electrode plate.

FIGS. 1A and 1B are schematic explanatory views of the electrode plate for a plasma processing apparatus according to the present embodiment. FIG. 1A is a perspective view of the electrode plate, and FIG. 1B is a sectional view of the electrode plate.

In FIG. 1A and FIG. 1B, the electrode plate 10 for a plasma processing apparatus is formed in a disk shape, and a plurality of air holes 11 which pass a gas for plasma generation are formed in the electrode plate 10. The electrode plate 10 for a plasma processing apparatus includes a base 12 and a coating layer 13 formed on a front surface of the base 12.

In the electrode plate 10 for a plasma processing apparatus according to the present embodiment, preferably, the diameter of the air hole 11 is within a range of 0.1 mm or more to 1.0 mm or less. Preferably, an aspect ratio of the air hole 11 of the base 12 (a thickness of the base 12/a diameter of the air hole 11) is equal to or higher than 3. When the aspect ratio of the air hole 11 is equal to or higher than 3, plasma is unlikely to reach a back surface of the electrode plate 10 for a plasma processing apparatus. Thus, it is possible to suppress consumption of a member disposed on the back surface of the electrode plate 10 for a plasma processing apparatus (for example, a cooling plate 15 in FIG. 2). In addition, in order to prevent backflow of the gas for plasma generation, preferably, the aspect ratio of the air hole 11 is equal to or lower than 50. A density of the air holes 11 is equal to or higher than 0.1 hole/cm$^2$ and equal to or lower than 0.5 holes/cm$^2$. On the other hand, the density of the air holes 11 is not limited thereto.

Preferably, a thickness of the base 12 is within a range of 1 mm or more to 20 mm or less. When the thickness of the base 12 is within the range, the strength of the electrode plate 10 for a plasma processing apparatus is improved. Thus, warpage and distortion by plasma are unlikely to occur, and a gas for plasma generation can be passed.

Preferably, the thickness of the coating layer 13 is within a range of 0.3 mm or more to 5.0 mm or less. When the thickness of the coating layer 13 is within the range, the time until the coating layer 13 is consumed and thus the base 12 is exposed can be increased. Therefore, it is possible to increase the use time of the electrode plate 10 for a plasma processing apparatus. When the thickness of the coating layer 13 exceeds 5.0 mm, the hole diameter of the air hole 11 in the coating layer 13 may change due to the consumption of the coating layer by plasma. As a result, it may difficult to adjust the flow rate of the gas for plasma generation. More preferably, the thickness of the coating layer 13 is within a range of 1.0 mm or more to 3.0 mm or less, and is not limited thereto.

In the electrode plate 10 for a plasma processing apparatus according to the present embodiment, the base 12 is formed of a material having a plasma resistance higher than the plasma resistance of a material forming the coating layer 13. Here, the fact that the base 12 is formed of a material having a high plasma resistance means that the consumption ratio is low when the base 12 is irradiated with plasma under the same condition. Comparison of plasma resistances of materials can be performed by evaluating the plasma resistance of each material as in experiment examples to be described. Preferably, the actual electrode plate 10 for a plasma processing apparatus is formed with the base 12 and the coating layer 13 having plasma resistances such that the consumption amount of inner walls of the air holes of the base 12 is equal to or smaller than 1/10 of the consumption amount (thickness) of the coating layer 13.

In the electrode plate 10 for a plasma processing apparatus according to the present embodiment, the material forming the base 12 is one or a mixture of two or more selected from the group consisting of $Y_2O_3$, $Al_2O_3$, and AlN, or a mixture of SiC and one or more selected from the group consisting of $Y_2O_3$, $Al_2O_3$, and AlN. More preferably, the material forming the base 12 is a mixture of SiC and one selected from the group consisting of $Y_2O_3$, $Al_2O_3$, and AlN, or a mixture of SiC and two or more selected from the group consisting of $Y_2O_3$, $Al_2O_3$, and AlN. In this case, preferably, the total content amount of $Y_2O_3$, $Al_2O_3$, and AlN is within a range of 3% by mass or more to 10% by mass or less. When the total content amount of $Y_2O_3$, $Al_2O_3$, and AlN is less than 3% by mass, the base 12 may have insufficient plasma resistance. On the other hand, when the total content amount of $Y_2O_3$, $Al_2O_3$, and AlN exceeds 10% by mass, the amount of impurities to be transferred to a wafer increases, and as a result, it may be difficult to manufacture a semiconductor device. Preferably, the content amount of $Y_2O_3$ is within a range of 3% by mass or more to 5% by mass or less, the content amount of $Al_2O_3$ is within a range of 3% by mass or more to 5% by mass or less, and the content amount of AlN is within a range of 3% by mass or more to 5% by mass or less. The content amounts of $Y_2O_3$, $Al_2O_3$, and AlN are not limited thereto.

In a case where the material forming the base 12 is one or a mixture of two or more selected from the group consisting of $Y_2O_3$, $Al_2O_3$, and AlN, preferably, the thickness of the base 12 is within a range of 4 mm or more to 10 mm or less. When manufacturing a substrate formed of $Y_2O_3$, preferably, the sintering temperature is within a range of 1500° C. or more to 1700° C. or less. When manufacturing a substrate formed of $Al_2O_3$, preferably, the sintering temperature is within a range of 1200° C. or more to 1400° C. or less. When manufacturing a substrate formed of AlN, preferably, the sintering temperature is within a range of 1600° C. or more to 1800° C. or less. In addition, preferably, the pressure is within a range of 30 MPa or more to 40 MPa or less, and is not limited thereto.

Preferably, the base 12 is a sintered body of the above-described material. Preferably, a raw material of the sintered body serving as the base 12 has a porosity of 2% or less.

In the electrode plate 10 for a plasma processing apparatus according to the present embodiment, a material forming the coating layer 13 is dense silicon carbide. The dense silicon carbide is silicon carbide having a density of 3.10 g/cm$^3$ or more. Preferably, the dense silicon carbide is CVD-SiC formed by chemical vapor deposition (CVD). Preferably, the density of the dense silicon carbide is within a range of 3.20 g/cm$^3$ or more to 3.21 g/cm$^3$ or less, and is not limited thereto.

The electrode plate 10 for a plasma processing apparatus according to the present embodiment can be manufactured by a method including, for example, a sintering step of obtaining a sintered body by sintering a material forming a base, a coating step of forming a coating layer formed of dense silicon carbide on a front surface of the sintered body, and an air hole-forming step of forming air holes in the sintered body on which the coating layer is formed.

In the sintering step, in a case where a mixture of SiC and one selected from the group consisting of $Y_2O_3$, $Al_2O_3$, and AlN, or a mixture of SiC and two or more selected from the group consisting of $Y_2O_3$, $Al_2O_3$, and AlN is used as a material forming the base, there is no particular limitation on a method of mixing the raw materials. The mixing may be performed in a wet manner or in a dry manner. For the mixing, a general mixing device such as a ball mill, which is used for mixing powders, may be used.

As a method of sintering the material forming the base, hot pressing, normal-pressure sintering, or hot isostatic pressing may be used. Preferably, a sintering temperature is within a range of 1900° C. or more to 2000° C. or less, and a sintering pressure is within a range of 30 MPa or more to 40 MPa or less. The sintering temperature and the sintering pressure are not limited thereto.

In the coating step, as a method of forming a coating layer, a CVD method may be used.

In the air hole-forming step, as a method of forming air holes in the sintered body on which the coating layer is formed, drill machining, ultrasonic machining, or laser machining may be used.

Figure 2:
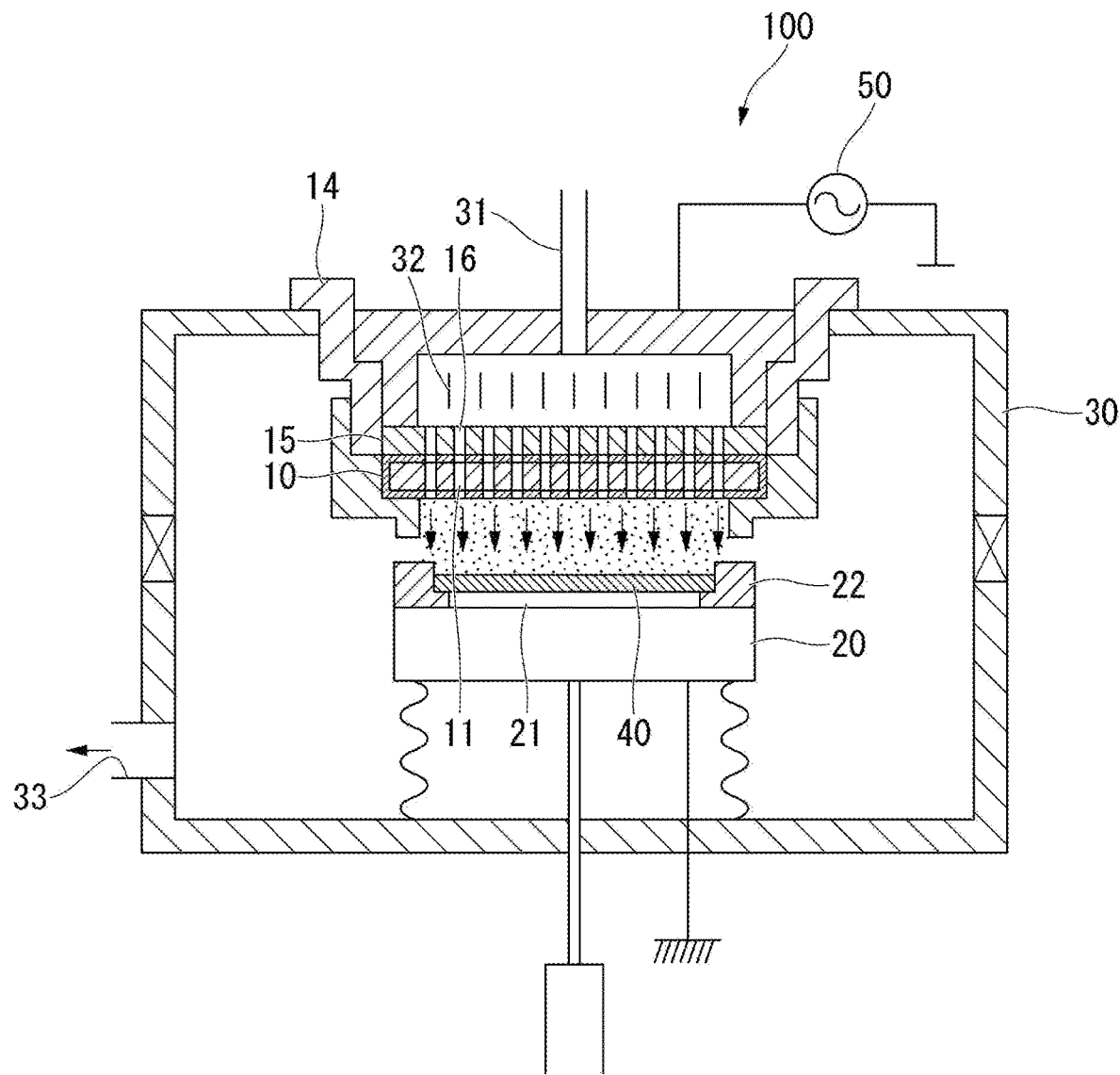
FIG. 2 is a schematic configuration diagram illustrating an example of a plasma etching apparatus using the electrode plate for a plasma processing apparatus according to the present embodiment.

FIG. 2 is a schematic configuration diagram illustrating an example of a plasma etching apparatus using the electrode plate for a plasma processing apparatus according to the present embodiment.

As illustrated in FIG. 2, in the plasma etching apparatus 100, the electrode plate 10 (an upper electrode) for a plasma processing apparatus according to the present embodiment is provided on an upper side of a vacuum chamber 30, and a vertically-movable support stand (a lower electrode) 20 is provided on a lower side in parallel with the electrode plate 10 for a plasma processing apparatus at a distance from each other. In this case, the upper electrode plate 10 for a plasma processing apparatus is supported in a state of being insulated from walls of the vacuum chamber 30 by an insulator 14. An electrostatic chuck 21 and a silicon support ring 22 surrounding the electrostatic chuck 21 are provided on the support stand 20. A wafer (a substrate to be processed) 40 is mounted on the electrostatic chuck 21 in a state where a circumferential edge is supported by the support ring 22. In addition, an etching gas supply pipe 31 is provided on the upper side of the vacuum chamber 30. An etching gas delivered from the etching gas supply pipe 31 passes through a diffusion member 32, flows toward the wafer 40 through the air holes 11 provided in the electrode plate 10 for a plasma processing apparatus, and then is discharged to the outside from an outlet 33 on a side portion of the vacuum chamber 30. On the other hand, a high-frequency voltage by a high-frequency power source 50 is applied between the electrode plate 10 for a plasma processing apparatus and the support stand 20.

In addition, a cooling plate 15, which is formed of aluminum or the like having excellent thermal conductivity, is fixed to a back surface of the electrode plate 10 for a plasma processing apparatus. In the cooling plate 15, through-holes 16 are also formed at the same pitch as that of the air holes 11 so as to communicate with the air holes 11 of the electrode plate 10 for a plasma processing apparatus. The electrode plate 10 for a plasma processing apparatus is fixed in the plasma etching apparatus 100 by screwing or the like in a state where the back surface is in contact with the cooling plate 15.

Figure 3:
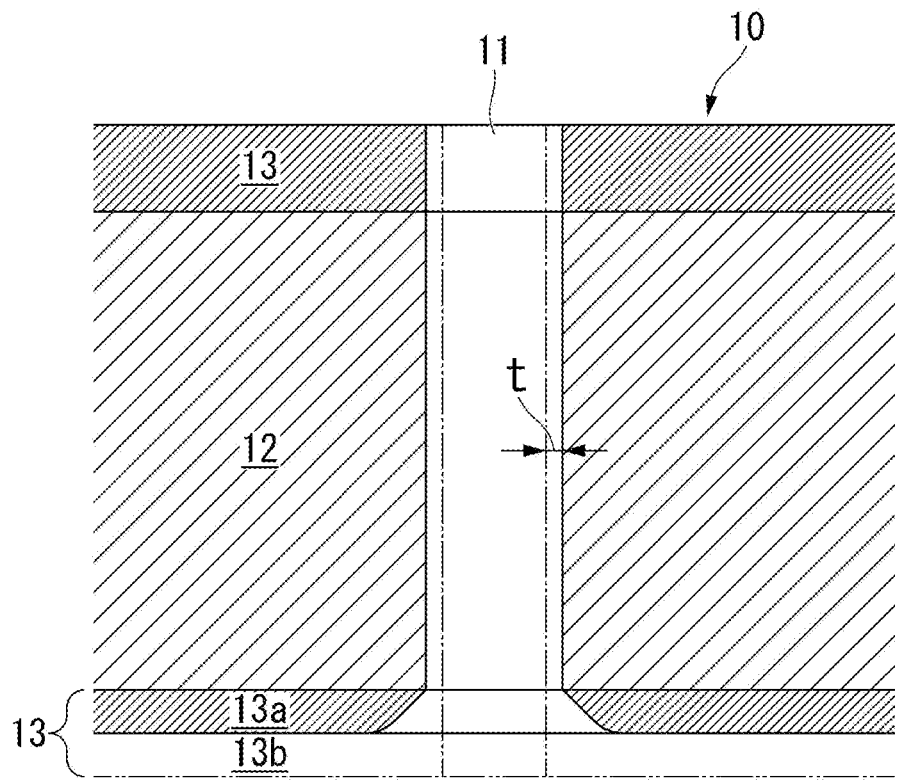
FIG. 3 is a schematic sectional view of an air hole of the electrode plate for a plasma processing apparatus after etching processing of a wafer is performed using the plasma etching apparatus illustrated in FIG. 2.

FIG. 3 is a schematic sectional view of the air hole 11 of the electrode plate 10 for a plasma processing apparatus after etching processing of the wafer 40 is performed using the plasma etching apparatus 100. In FIG. 3, a broken line represents a state before etching processing is performed, and a solid line represents a state after etching processing is performed. In addition, the gas for plasma generation passes through the air hole 11 from an upper side to a lower side (in a direction of arrows of FIG. 2), and plasma is generated below the electrode plate 10 for a plasma processing apparatus. Therefore, in FIG. 3, the lower coating layer 13 of the electrode plate 10 for a plasma processing apparatus is consumed. 13a represents the remaining portion of the coating layer remaining without being consumed by plasma, and 13b represents the consumed portion of the coating layer consumed by plasma.

As illustrated in FIG. 3, in the coating layer 13 of the electrode plate 10 for a plasma processing apparatus, a portion around the air hole 11 is consumed in a tapered shape by etching processing. Preferably, inner walls of the air holes 11 of the base 12 are not substantially consumed. For example, in a case where the diameter of the air hole 11 is 0.5 mm and the thickness of the coating layer 13 is 3.0 mm, even when etching processing is performed through the air hole 11 until an end surface of the base 12 appears, preferably, a consumed thickness t of the inner wall of the air hole 11 of the base 12 is equal to or thinner than 0.005 mm.

Figure 4:
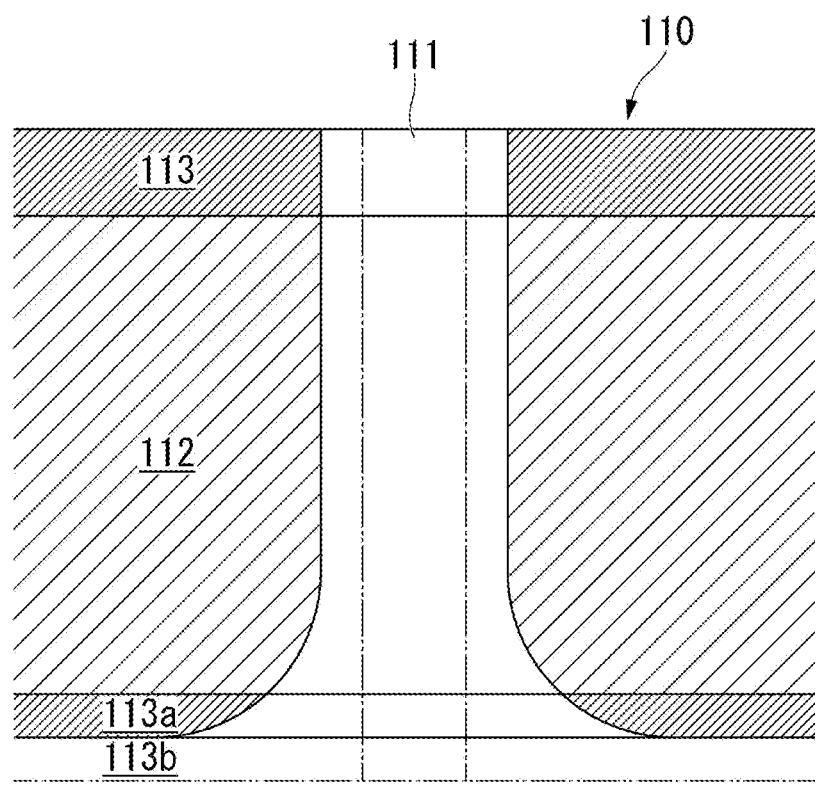
FIG. 4 is a schematic sectional view illustrating a state after etching processing of a wafer is performed using the electrode plate for a plasma processing apparatus in which a material forming a coating layer has a plasma resistance higher than the plasma resistance of a material forming a base.

FIG. 4 is a schematic sectional view illustrating a state after etching processing of the wafer is performed using the electrode plate for a plasma processing apparatus in which the material forming the coating layer has a plasma resistance higher than the plasma resistance of the material forming the base. In the electrode plate 110 for a plasma processing apparatus illustrated in FIG. 4, the base 112 is an SiC sintered body, and the coating layer 113 is formed of CVD-SiC. In FIG. 4, a broken line represents a state before etching processing is performed, and a solid line represents a state after etching processing is performed. 113a represents the remaining portion of the coating layer remaining without being consumed by plasma, and 113b represents the consumed portion of the coating layer consumed by plasma.

As illustrated in FIG. 4, in the electrode plate 110 for a plasma processing apparatus in which the material forming the coating layer 113 has a plasma resistance higher than the plasma resistance of the material forming the base 112, inner walls of the air holes 111 of the base 112 are greatly consumed by plasma. For this reason, the flow rate of the gas for plasma generation passing through the air hole 111 greatly changes, and as a result, it becomes difficult to stably perform etching processing.

Next, a method for regenerating the electrode plate for a plasma processing apparatus according to the present embodiment will be described.

As illustrated in FIG. 3, the method for regenerating the electrode plate for a plasma processing apparatus according to the present embodiment is, for example, a method for regenerating the electrode plate for a plasma processing apparatus in which a front surface of the coating layer is consumed by plasma. The method for regenerating the electrode plate for a plasma processing apparatus according to the present embodiment includes a step of recoating a dense silicon carbide layer on a front surface of the electrode plate for a plasma processing apparatus, and a step of removing the dense silicon carbide layer coated on surfaces of the air holes of the electrode plate for a plasma processing apparatus. When a front surface of the coating layer 13 is consumed by plasma and thus the thickness of the coating layer 13 becomes equal to or thinner than 95% of the thickness of the coating layer 13 before etching processing is performed, it may be determined that the coating layer 13 is consumed.

Figure 5:
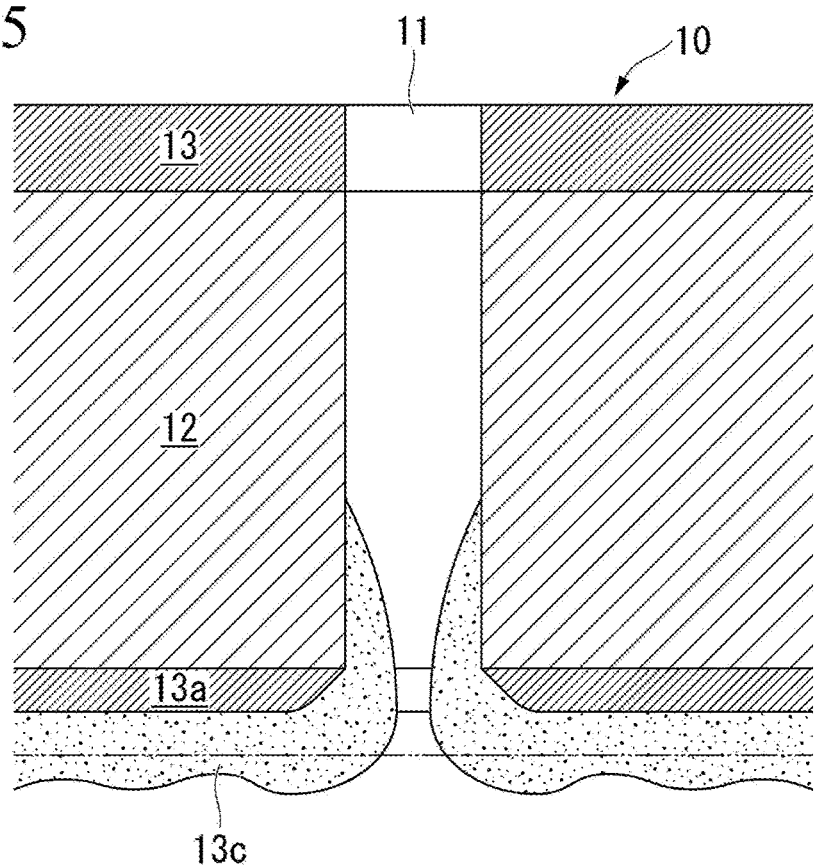
FIG. 5 is a sectional view explaining a step of recoating a dense silicon carbide layer on a front surface of the electrode plate for a plasma processing apparatus in a method for regenerating the electrode plate for a plasma processing apparatus according to the present embodiment.

FIG. 5 is a sectional view explaining a state where a dense silicon carbide layer is recoated on the front surface of the electrode plate for a plasma processing apparatus.

In the method for regenerating the electrode plate for a plasma processing apparatus according to the present embodiment, a dense silicon carbide layer 13c is a layer consisting of CVD-SiC formed by a CVD method. The dense silicon carbide layer 13c is formed to have a thickness exceeding the thickness of the consumed portion 13b of the coating layer 13, and the diameter of the air hole 11 is partially narrowed. Preferably, the thickness of the dense silicon carbide layer 13c is within a range of 1 mm or more to 5 mm or less, and is not limited thereto.

Figure 6:
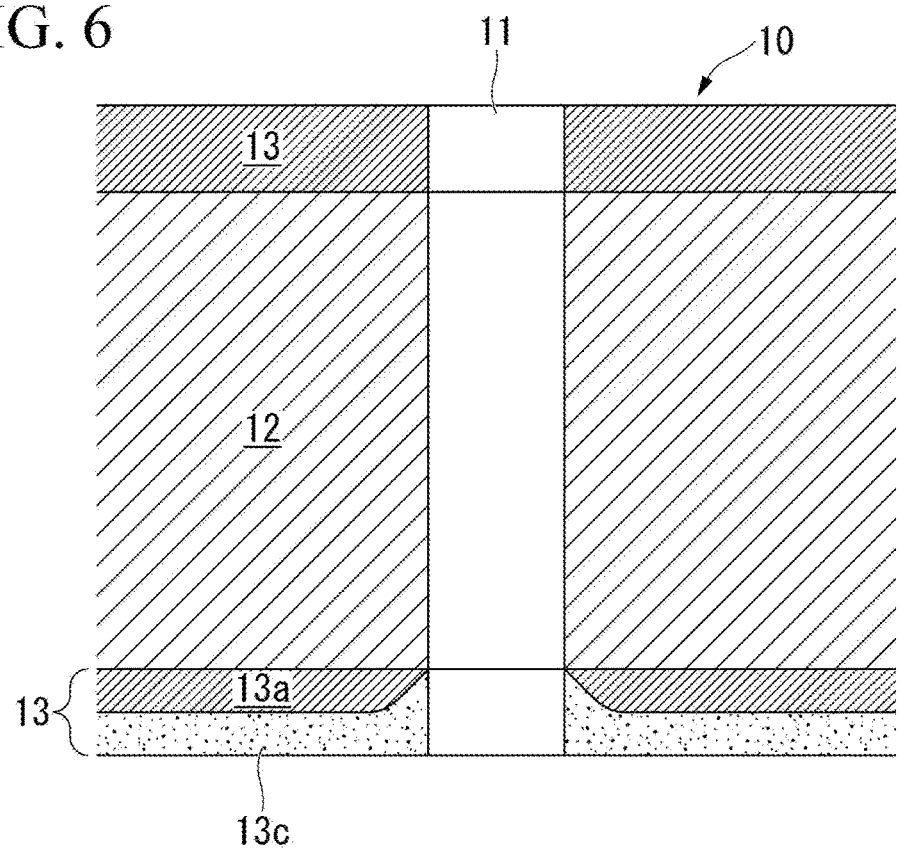
FIG. 6 is a sectional view explaining a step of removing the dense silicon carbide layer formed on a surface of the air hole in the method for regenerating the electrode plate for a plasma processing apparatus according to the present embodiment.

FIG. 6 is a sectional view explaining a state where the dense silicon carbide layer 13c formed on the surface of the air hole is removed.

In the method for regenerating the electrode plate for a plasma processing apparatus according to the present embodiment, the dense silicon carbide layer 13c, which is coated on the surfaces of the air holes of the electrode plate for a plasma processing apparatus, is removed. Thereby, the diameter of the air hole 11 is returned to a state before regeneration, and the material of the base 12 having a high plasma resistance is exposed by the inner walls of the air holes 11 of the base 12. When the dense silicon carbide layer 13c remains on the inner walls of the air holes 11 of the base 12, the dense silicon carbide layer 13c remaining on the inner walls of the air holes 11 is consumed during etching processing using plasma, and, as a result, the hole diameter of the air hole 11 is widened. For this reason, the flow rate of the gas for plasma generation changes, and thus it may be difficult to stably perform etching processing. As a method of removing the dense silicon carbide layer 13c, drill machining, ultrasonic machining, or laser machining may be used. In addition, the dense silicon carbide layer 13c formed on the front surface of the remaining portion 13a of the coating layer 13 is removed such that the coating layer 13 has a suitable thickness before etching processing is performed. As a method of removing the dense silicon carbide layer 13c, surface grinding may be used.

In the electrode plate 10 for a plasma processing apparatus according to the present embodiment, the base 12 is formed of a material having a plasma resistance higher than the plasma resistance of a material forming the coating layer 13. Thereby, the inner walls of the air holes 11 of the base 12 are less likely to be consumed by plasma than the coating layer 13 is consumed. Accordingly, the electrode plate for a plasma processing apparatus according to the present embodiment can be stably used for a long time without causing a change in the flow rate of the gas for plasma generation during etching processing using plasma.

In the electrode plate 10 for a plasma processing apparatus according to the present embodiment, the material forming the base 12 is one or a mixture of two or more selected from the group consisting of $Y_2O_3$, $Al_2O_3$, and AlN, a mixture of SiC and one selected from the group consisting of $Y_2O_3$, $Al_2O_3$, and AlN, or a mixture of SiC and two or more selected from the group consisting of $Y_2O_3$, $Al_2O_3$, and AlN, and the material forming the coating layer 13 is dense silicon carbide. Thus, the base 12 can be reliably made so as to have a plasma resistance higher than the plasma resistance of the coating layer 13.

In the method for regenerating the electrode plate for a plasma processing apparatus according to the present embodiment, the base is formed of a material having a plasma resistance higher than the plasma resistance of the dense silicon carbide forming the coating layer. Thus, it is possible to regenerate the electrode plate for a plasma processing apparatus before the inner walls of the air holes of the base are consumed. Therefore, according to the method for regenerating the electrode plate for a plasma processing apparatus according to the present embodiment, it is possible to regenerate the electrode plate for a plasma processing apparatus without changing the flow rate of the gas for plasma generation.

As described above, the embodiment according to the present invention has been described. On the other hand, the present invention is not limited to the embodiment, and may be appropriately modified without departing from the spirit of the invention.

For example, in the present embodiment, the electrode plate 10 for a plasma processing apparatus is formed in a disk shape. On the other hand, the shape of the electrode plate 10 for a plasma processing apparatus is not particularly limited, and may be a square plate shape.

In addition, in the present embodiment, the material forming the base 12 is one or a mixture of two or more selected from the group consisting of $Y_2O_3$, $Al_2O_3$, and AlN, a mixture of SiC and one selected from the group consisting of $Y_2O_3$, $Al_2O_3$, and AlN, or a mixture of SiC and two or more selected from the group consisting of $Y_2O_3$, $Al_2O_3$, and AlN, and the material forming the coating layer 13 is dense silicon carbide. On the other hand, the material forming the base 12 and the material forming the coating layer 13 are not limited thereto. There is no problem as long as the base 12 is formed of a material having a plasma resistance higher than the plasma resistance of a material forming the coating layer 13. Preferably, the materials of the base 12 and the coating layer 13 are appropriately selected according to the gas for plasma generation and a material of a wafer to be etched (a substrate to be processed).

EXAMPLES

Hereinafter, evaluation test results obtained by evaluating effects of the electrode plate for a plasma processing apparatus according to the present invention will be described.

First, as a preliminary test, plasma resistances of electrode materials manufactured by the following experiment examples 1 to 7 are evaluated.

Experiment Example 1

(Manufacturing of SiC Sintered Body)

An SiC powder (purity: 99.9% by mass, average particle size: 0.4 μm) is prepared. A mold is filled with the prepared SiC powder, and pressure sintering is performed using hot pressing under a condition of 2000° C. and 40 MPa. The obtained sintered body is polished, and thus an SiC sintered body having a diameter of 400 mm and a thickness of 10 mm is manufactured. The obtained sintered body has a porosity of 2% or less.

Experiment Example 2

(Manufacturing of CVD-SiC)

A silicon substrate (diameter: 40 mm, thickness: 5 mm) is prepared. A CVD-SiC having a thickness of 10 mm is manufactured on a front surface of the prepared silicon substrate by using a CVD apparatus.

Experiment Example 3

(Manufacturing of SiC Sintered Body Containing 3% by Mass of $Y_2O_3$)

A $Y_2O_3$ powder (purity: 99.9% by mass, average particle size: 3 μm) and an SiC powder (purity: 99.9% by mass, average particle size: 4 μm) are prepared.

A powder mixture is obtained by mixing the prepared $Y_2O_3$ powder and SiC powder using a ball mill in a mass ratio of 3:97 ($Y_2O_3$ powder:SiC powder). A mold is filled with the obtained powder mixture, and pressure sintering is performed using hot pressing under a condition of 2000° C. and 40 MPa. The obtained sintered body is polished, and thus an SiC sintered body containing 3% by mass of $Y_2O_3$ and having a diameter of 400 mm and a thickness of 10 mm is manufactured. The obtained sintered body has a porosity of 2% or less.

Experiment Example 4

(Manufacturing of SiC Sintered Body Containing 5% by Mass of $Y_2O_3$)

An SiC sintered body containing 5% by mass of $Y_2O_3$ is manufactured in the same manner as in Experiment Example 3, except that a mixing ratio of the $Y_2O_3$ powder and the SiC powder is 5:95 ($Y_2O_3$ powder:SiC powder) in mass ratio. The obtained sintered body has a porosity of 2% or less.

Experiment Example 5

(Manufacturing of SiC Sintered Body Containing 10% by Mass of $Y_2O_3$)

An SiC sintered body containing 10% by mass of $Y_2O_3$ is obtained in the same manner as in Experiment Example 3, except that a mixing ratio of the $Y_2O_3$ powder and the SiC powder is 10:90 ($Y_2O_3$ powder:SiC powder) in mass ratio. The obtained sintered body has a porosity of 2% or less.

Experiment Example 6

(Manufacturing of SiC Sintered Body Containing 3% by Mass of $Al_2O_3$)

An $Al_2O_3$ powder (purity: 99.9% by mass, average particle size: 0.3 μm) is prepared.

An SiC sintered body containing 3% by mass of $Al_2O_3$ is manufactured in the same manner as in Experiment Example 3, except that the $Al_2O_3$ powder is used instead of the $Y_2O_3$ powder and the $Al_2O_3$ powder and the SiC powder are mixed with each other using a ball mill in a ratio of 3:97 ($Al_2O_3$ powder:SiC powder) in mass ratio. The obtained sintered body has a porosity of 2% or less.

Experiment Example 7

(Manufacturing of SiC Sintered Body Containing 3% by Mass of AlN)

An AlN powder (purity: 99.9% by mass, average particle size: 0.5 μm) is prepared.

An SiC sintered body containing 3% by mass of AlN is manufactured in the same manner as in Experiment Example 3, except that the AlN powder is used instead of the $Y_2O_3$ powder and the AlN powder and the SiC powder are mixed with each other using a ball mill in a ratio of 3:97 (AlN powder:SiC powder) in mass ratio. The obtained sintered body has a porosity of 2% or less.

(Evaluation of Plasma Resistance)

A part of a front surface of the electrode material manufactured in each of the experiment examples 1 to 7 is masked. The masked electrode material is provided in a RIE plasma etching apparatus. Next, after air in the RIE plasma etching apparatus is evacuated, an $SF_4$ gas is introduced at a flow rate of 50 sccm, and plasma is applied to the electrode material at 500 W for one hour. After plasma is applied, the electrode material is taken out of the RIE plasma etching apparatus. The masking of the electrode material is removed, and the difference in level between the masked portion and the unmasked portion is measured as the consumed amount by the applied plasma. The consumed amount of the electrode material measured is evaluated as the consumption ratio (=consumed amount of electrode material/consumed amount of SiC sintered body) when the consumed amount of the SiC sintered body manufactured in the experiment example 1 is set to 1. The results are shown in Table 1.

TABLE 1

| | Material | Consumption Ratio |
|---|---|---|
| Experiment Example 1 | SiC sintered body | 1 |
| Experiment Example 2 | CVD-SiC | 0.873 |
| Experiment Example 3 | SiC sintered body containing 3% by mass of $Y_2O_3$ | 0.383 |
| Experiment Example 4 | SiC sintered body containing 5% by mass of $Y_2O_3$ | 0.375 |
| Experiment Example 5 | SiC sintered body containing 10% by mass of $Y_2O_3$ | 0.355 |
| Experiment Example 6 | SiC sintered body containing 3% by mass of $Al_2O_3$ | 0.834 |
| Experiment Example 7 | SiC sintered body containing 3% by mass of AlN | 0.840 |

Based on the consumption ratios in Table 1, it is confirmed that the electrode materials manufactured in Experiment Examples 1 to 7 have high plasma resistances in order of the SiC sintered body, the CVD-SiC, the SiC sintered body containing 3% by mass of AlN, the SiC sintered body containing 3% by mass of $Al_2O_3$, the SiC sintered body containing 3% by mass of $Y_2O_3$, the SiC sintered body containing 5% by mass of $Y_2O_3$, and the SiC sintered body containing 10% by mass of $Y_2O_3$.

Example 1 of Present Invention

In the same manner as in Experiment Example 3, an SiC sintered body containing 3% by mass of $Y_2O_3$ and having a diameter of 400 mm and a thickness of 10 mm is manufactured.

The obtained SiC sintered body containing 3% by mass of $Y_2O_3$ is used as a base, and a CVD-SiC layer having a thickness of 2 mm is formed on one side surface of the base using a CVD apparatus. Next, air holes having a diameter of 0.5 mm are uniformly formed at intervals of 10 mm in the obtained stacked-body using a laser apparatus, and thus an electrode plate for a plasma processing apparatus is manufactured.

Example 2 of Present Invention

An electrode plate for a plasma processing apparatus is manufactured in the same manner as in Example 1 of the present invention, except that an SiC sintered body, which is manufactured in the same manner as in Experiment Example 4 and contains 5% by mass of $Y_2O_3$, is used as a base.

Example 3 of Present Invention

An electrode plate for a plasma processing apparatus is manufactured in the same manner as in Example 1 of the present invention, except that an SiC sintered body, which is manufactured in the same manner as in Experiment Example 5 and contains 10% by mass of $Y_2O_3$, is used as a base.

Example 4 of Present Invention

An electrode plate for a plasma processing apparatus is manufactured in the same manner as in Example 1 of the present invention, except that an SiC sintered body, which is manufactured in the same manner as in Experiment Example 6 and contains 3% by mass of $Al_2O_3$, is used as a base.

Example 5 of Present Invention

An electrode plate for a plasma processing apparatus is manufactured in the same manner as in Example 1 of the present invention, except that an SiC sintered body, which is manufactured in the same manner as in Experiment Example 7 and contains 3% by mass of AlN, is used as a base.

Comparative Example 1

An electrode plate for a plasma processing apparatus is manufactured in the same manner as in Example 1 of the present invention, except that an SiC sintered body, which is manufactured in the same manner as in Experiment Example 1, is used as a base.

In the electrode plate for a plasma processing apparatus manufactured in each of Examples 1 to 5 of the present invention and Comparative Example 1, the plasma resistance and a change in the hole diameter of the air hole by regeneration after plasma processing are evaluated as follows.

(Plasma Resistance)

A part of a front surface of the manufactured electrode plate for a plasma processing apparatus is masked. The masked electrode plate for a plasma processing apparatus is provided in the plasma etching apparatus illustrated in FIG. 2, and etching processing of a wafer is performed. After air in the vacuum chamber is evacuated, and an $SF_4$ gas is introduced at a flow rate of 50 sccm, etching processing is performed at 500 W for 300 hours. After the etching processing, the electrode plate for a plasma processing apparatus is taken out of the plasma etching apparatus. After the masking of the electrode plate for a plasma processing apparatus is removed, a sample obtained by cutting the electrode plate at the center of the air hole is filled with a resin, and a cut surface of the sample is polished to expose a section of the air hole. Sections of the air hole and the coating layer are observed using a scanning electron microscope (SEM), and consumption degrees of the air hole and the coating layer after plasma processing are obtained as follows.

The results are shown in Table 2.

(Consumption Degree of Air Hole)

A consumption degree of the air hole corresponds to a consumption degree of the inner wall of the air hole of the base (corresponding to t in FIG. 3). The hole diameter (hole diameter after plasma processing) of the air hole is measured at the center portion of the air hole in a depth direction (the center portion of the base of the electrode plate for a plasma processing apparatus in the thickness direction), and the consumption degree of the air hole is calculated by the following equation.

Consumption Degree of Air Hole={Hole Diameter after Etching Processing−Hole Diameter before Etching Processing(0.5 mm)}/2

(Consumption Degree of Coating Layer)

A consumption degree of the coating layer corresponds to the thickness of a portion consumed by plasma processing (corresponding to the thickness of the consumed portion 13b in FIG. 3). A difference in level between a portion within 100 mm from the center of the electrode plate and a portion from which masking is removed is measured, and the measured value is considered as the consumption degree of the coating layer.

TABLE 2

| | Material | | Consumption Degree after Etching Processing | |
|---|---|---|---|---|
| | Base | Coating Layer | Inner Wall of Air Hole of Base | Coating Layer |
| Example 1 | SiC sintered body containing 3% by mass of $Y_2O_3$ | CVD-SiC | 0.0022 mm | 0.051 mm |
| Example 2 | SiC sintered body containing 5% by mass of $Y_2O_3$ | CVD-SiC | 0.0022 mm | 0.051 mm |
| Example 3 | SiC sintered body containing 10% by mass of $Y_2O_3$ | CVD-SiC | 0.0021 mm | 0.052 mm |
| Example 4 | SiC sintered body containing 3% by mass of $Al_2O_3$ | CVD-SiC | 0.0046 mm | 0.049 mm |
| Example 5 | SiC sintered body containing 3% by mass of AlN | CVD-SiC | 0.0048 mm | 0.050 mm |
| Comparative Example 1 | SiC sintered body | CVD-SiC | 0.0057 mm | 0.050 mm |

When comparing Examples 1 to 5 of the present invention with Comparative Example 1, it is confirmed that the consumption degree of the coating layer is the same in Examples 1 to 5 of the present invention and Comparative Example 1, while the consumption degree of the inner wall of the air hole of the base is significantly reduced in Examples 1 to 5 of the present invention. In particular, in Examples 1 to 3 of the present invention in which the SiC sintered body containing $Y_2O_3$ is used as the base, it is confirmed that the consumption degree of the inner wall of the air hole of the base is reduced to ½ or less as compared with Comparative Example 1.

(Change in Hole Diameter of Air Hole by Regeneration after Plasma Processing)

The manufactured electrode plate for a plasma processing apparatus is provided in the plasma etching apparatus illustrated in FIG. 2, and etching processing of a wafer is performed under the same condition as in the evaluation of the plasma resistance. After the etching processing, the electrode plate for a plasma processing apparatus is taken out of the plasma etching apparatus. Openings of some air holes are masked. A front surface of the masked electrode plate for a plasma processing apparatus is recoated with a CVD-SiC layer having a thickness of 2 mm using a CVD apparatus. Next, the CVD-SiC layer, which is coated on the inner wall surface of the air hole of the electrode plate for a plasma processing apparatus, is removed using a laser apparatus.

After the masking of the regenerated electrode plate for a plasma processing apparatus is removed, a sample obtained by cutting the electrode plate at the center of the air hole is filled with a resin, and a cut surface of the sample is polished to expose a section of the air hole. A section of the air hole with a masked opening (air hole before regeneration) and a section of the air hole with an unmasked opening (air hole after regeneration) are each observed using a scanning electron microscope (SEM). Thereby, the hole diameter of the air hole is measured at the center portion of the air hole in a depth direction (the center portion of the base of the electrode plate for a plasma processing apparatus in the thickness direction). The results are shown in Table 3.

TABLE 3

| | Material | | Hole Diameter of Air Hole | | |
|---|---|---|---|---|---|
| | Base | Coating Layer | Before Etching | Before Regenerating | After Regenerating |
| Example 1 | SiC sintered body containing 3% by mass of $Y_2O_3$ | CVD-SiC | 0.5001 mm | 0.5045 mm | 0.5049 mm |
| Example 2 | SiC sintered body containing 5% by mass of $Y_2O_3$ | CVD-SiC | 0.4999 mm | 0.5043 mm | 0.5046 mm |
| Example 3 | SiC sintered body containing 10% by mass of $Y_2O_3$ | CVD-SiC | 0.4998 mm | 0.5040 mm | 0.5043 mm |
| Example 4 | SiC sintered body containing 3% by mass of $Al_2O_3$ | CVD-SiC | 0.5003 mm | 0.5093 mm | 0.5096 mm |
| Example 5 | SiC sintered body containing 3% by mass of AlN | CVD-SiC | 0.4999 mm | 0.5093 mm | 0.5097 mm |

TABLE 3-continued

| | Material | | Hole Diameter of Air Hole | | |
|---|---|---|---|---|---|
| | Base | Coating Layer | Before Etching | Before Regenerating | After Regenerating |
| Comparative Example 1 | SiC sintered body | CVD-SiC | 0.5002 mm | 0.5116 mm | 0.5121 mm |

In the electrode plate for a plasma processing apparatus according to Comparative Example 1, the hole diameter of the air hole after regeneration is widened by 0.01 mm (2%) or more as compared with the hole diameter (0.5 mm) of the air hole before etching processing. In the electrode plate for a plasma processing apparatus in which the hole diameter of the air hole is 0.5 mm and the aspect ratio of the air hole is 20 (=10 mm/0.5 mm), when the hole diameter of the air hole is widened by a degree exceeding 0.01 mm, controlling of the flow rate of the gas flowing through the air hole becomes difficult. For this reason, it is confirmed that the electrode plate for a plasma processing apparatus according to Comparative Example 1 cannot be easily used after regeneration.

On the other hand, the electrode plate for a plasma processing apparatus according to each of Examples 1 to 5 of the present invention can be easily used after regeneration because the hole diameter of the air hole after regeneration is slightly widened by a degree of 0.01 mm or less.

Based on the results, according to Examples 1 to 5 of the present invention, it is confirmed that the electrode plate for a plasma processing apparatus, which can be easily used after regeneration and in which the inner walls of the air holes are unlikely to be consumed, can be provided.

INDUSTRIAL APPLICABILITY

According to the present invention, it is possible to provide an electrode plate for a plasma processing apparatus that can be stably used for a long time without causing a change in the flow rate of the gas for plasma generation during etching processing using plasma.

REFERENCE SIGNS LIST

10: Electrode Plate for Plasma Processing Apparatus
11: Air Hole
12: Base
13: Coating Layer
13a: Remaining Portion
13b: Consumed Portion
13c: Dense Silicon Carbide Layer
14: Insulator
20: Support Stand (Lower Electrode)
21: Electrostatic Chuck
22: Support Ring
30: Vacuum Chamber
31: Etching Gas Supply Pipe
32: Diffusion Member
33: Outlet
40: Wafer (Substrate to be processed)
50: High-Frequency Power Source
100: Plasma Etching Apparatus
110: Electrode Plate for Plasma Processing Apparatus
111: Air Hole
112: Base
113: Coating Layer
113a: Remaining Portion
113b: Consumed Portion

The invention claimed is:

1. An electrode plate for a plasma processing apparatus, which includes an air hole through which a gas for plasma generation passes, the electrode plate comprising: a base having a plurality of air holes; and a coating layer provided on at least one front surface of the base, wherein the base is formed of a material having a plasma resistance higher than the plasma resistance of a material forming the coating layer, wherein the material forming the base is a mixture of SiC and one or more selected from the group consisting of $Y_2O_3$, $Al_2O_3$, and AlN, wherein the material forming the coating layer is dense silicon carbide, and wherein an aspect ratio of the air hole of the base, calculated by a thickness of the base divided by a diameter of the air hole, is equal to or higher than 3 and equal to or lower than 50.

2. The electrode plate for a plasma processing apparatus according to claim 1, wherein a thickness of the base is within a range of 1 mm or more to 20 mm or less.

3. The electrode plate for a plasma processing apparatus according to claim 1, wherein a thickness of the coating layer is within a range of 0.3 mm or more to 5.0 mm or less.

4. The electrode plate for a plasma processing apparatus according to claim 1, wherein the dense silicon carbide is silicon carbide having a density of 3.10 g/cm3 or more.

5. The electrode plate for a plasma processing apparatus according to claim 1, wherein in the mixture of SiC and one or more selected from the group consisting of $Y_2O_3$, $Al_2O_3$, and AlN, an amount of $Y_2O_3$ is within a range of 3% by mass or more to 5% by mass or less, an amount of $Al_2O_3$ is within a range of 3% by mass or more to 5% by mass or less, and an amount of AlN is within a range of 3% by mass or more to 5% by mass or less.

6. The electrode plate for a plasma processing apparatus according to claim 1, wherein the material forming the base is a mixture of SiC and $Y_2O_3$.

7. A method for regenerating the electrode plate for a plasma processing apparatus according to claim 1, the method comprising: a step of recoating a dense silicon carbide layer on a front surface of the electrode plate for the plasma processing apparatus by chemical vapor deposition after consuming a front surface of the coating layer by plasma; and a step of removing the dense silicon carbide layer coated on a surface of the air hole of the electrode plate for a plasma processing apparatus.

* * * * *